United States Patent [19]

Mochiji et al.

[11] 4,403,151
[45] Sep. 6, 1983

[54] METHOD OF FORMING PATTERNS

[75] Inventors: Kozo Mochiji, Tachikawa; Yozi Maruyama, Hachioji; Shinji Okazaki, Urawa; Fumio Murai, Tokyo, all of Japan

[73] Assignee: Hitachi, Ltd., Tokyo, Japan

[21] Appl. No.: 250,217

[22] Filed: Apr. 2, 1981

[30] Foreign Application Priority Data

Apr. 2, 1980 [JP] Japan ................................ 55/42021
Jun. 27, 1980 [JP] Japan ................................ 55/86626

[51] Int. Cl.³ ............................................. H05K 3/06
[52] U.S. Cl. ................................................. 250/492.2
[58] Field of Search ..................................... 250/492.2

[56] References Cited

U.S. PATENT DOCUMENTS 4,099,062  7/1978  Kitcher ........................... 250/492.2
4,298,803  11/1981  Matsuura et al. ................ 250/492.2

Primary Examiner—Bruce C. Anderson
Assistant Examiner—Jack I. Berman
Attorney, Agent, or Firm—Antonelli, Terry & Wands

[57] ABSTRACT

Desired portions of the positive-type photoresist film are irradiated with an electron beam, and regions including at least the regions irradiated with the electron beam are further irradiated with ultraviolet light, followed by developing.

The photosensitive radicals are destroyed in the regions which are irradiated with the electron beam. Therefore, the solubility of the photoresist film is not increased even when it is irradiated with ultraviolet light, and resist patterns are formed by developing.

12 Claims, 11 Drawing Figures

METHOD OF FORMING PATTERNS

BACKGROUND OF THE INVENTION

1. Field of the Invention

The present invention relates to a method of forming patterns, and more specifically to a method of forming fine patterns, useful in producing e.g., various semiconductor devices and magnetic bubble memory elements, by utilizing both the electron beam lithographic exposure method and the ultraviolet light exposure method.

2. Description of the Prior Art

The trend toward high densities and high integration degrees in modern magnetic bubble memory elements and semiconductor integrated circuits has been placing increasing demands for the development of methods which are capable of accurately and easily forming fine patterns having very fine line widths and gaps.

So far, a variety of patterns of magnetic bubble memory elements and semiconductor integrated circuits have, in general, been formed by the method called photolithography.

With the conventional photolithography employing ultraviolet light of a wavelength of about 320 to 500 nm, however, it is difficult to form fine patterns maintaining high precision due to the effects of diffraction and interference that are characteristics inherent in the light. In order to accurately form fine patterns without adverse effects due to the wavelengths of the light, there has been proposed a so-called electron beam lithographic method which employs electron beams having wavelengths which are very much shorter than the wavelengths of ultraviolet light, instead of employing the ultraviolet light.

The wavelengths of the electron beam are so much shorter than the wavelengths of the ultraviolet light that adverse effects caused by the interference and diffraction can be neglected, and very fine patterns can be formed while maintaining precision.

According to electron beam lithography, a pattern is described by the electron beam on a resist film applied onto a workpiece (such as metal film, silicon oxide film or the like), and is subjected to development to form a desired resist pattern.

By using the resist pattern as a mask, the underlying workpiece is processed by etching to form a pattern of the workpiece. With a so-called wet etching employing an etching solution, however, it is difficult to accurately form fine patterns of the order of smaller than 1 $\mu$m. Therefore, a dry etching method is employed by utilizing sputtering properties of low-temperature plasma or high-speed ions. Therefore, the resist film exposed to the electron beam must have high resolving power, and must not be deteriorated or deformed by the dry etching.

At present, however, there is no resist film for exposure to an electron beam that has high resolving power and excellent resistance against the dry etching; this fact hinders the development of electron beam lithographic methods.

For example, the PMMA (polymethyl methacrylate), which is a positive-type resist for exposure to an electron beam, has good resolving power and is capable of forming a resist pattern having a width of about 0.8 $\mu$m. However, if the PSG film (phosphorus glass film) is subjected to the etching by the reactive sputtering using $C_4F_8$ and helium gases with the PMMA as a mask, abnormal wrinkles develop on the whole surfaces of the resist film. Namely, the pattern is deformed by the wrinkles, and it becomes difficult to obtain a good resist pattern.

The PGMA (polyglycidyl methacrylate), which is a negative resist for exposure to an electron beam gives a resolving power of up to about 1.2 $\mu$m. When the aluminum film is subjected to etching by reactive sputtering using $BCl_3$ gas with the PGMA as a mask, however, the thickness of the PGMA must be increased since it has a large etching ratio. Consequently, it is impossible to realize the resolving power of the order of 1 $\mu$m.

Moreover, although various resists for exposure to an electron beam have been developed, there is still available no resist film which has high resolving power and resistance against dry etching.

Therefore, it is difficult to form good fine patterns by electron beam lithography unless some contrivance is made to the process of electron beam lithography.

With electron lithography, furthermore, the portions to be exposed must be successively scanned by the electron beam which is finely converged. Therefore, the scanning requires extended periods of time, and the produceability is small.

SUMMARY OF THE INVENTION

The object of the present invention is to solve the above-mentiond problems of the conventional method of forming patterns, and is to provide a method of forming fine patterns maintaining high precision.

Another object of the present invention is to provide a method of forming fine resist patterns having excellent resistance against dry etching and high resolving power, by improving the defects of the conventional electron beam lithography which employs a resist film for exposure to the electron beam.

A further object of the present invention is to provide a method of forming patterns, which is capable of forming fine patterns very quickly.

In order to accomplish the above-mentioned objects, the present invention utilizes special properties of the photoresist against the electron beam and ultraviolet light, and further utilizes pattern lithography relying upon the electron beam and exposure by the ultraviolet light, in order to quickly form fine patterns maintaining high precision.

DESCRIPTION OF THE PREFERRED EMBODIMENTS

The invention will be explained below in detail with reference to working embodiments.

EXAMPLE 1

Referring to FIG. 1(*a*), a positive-type photoresist AZ1350J (trade name, a product of Shippley Co., U.S.A.) is applied as a resist film 1 to a thickness of 0.6 to 1.0 μm on the surface of a film (metal film, insulating film or the like on a semiconductor substrate) 2 on which a pattern is to be formed.

The resist film 1 is heat-treated at 90° C. for 30 minutes (this heat treatment is referred to as pre-bake in this specification).

Figure 1A:
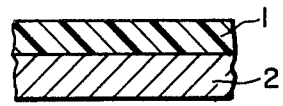
FIGS. 1(*a*) to 1(*d*) are a diagram illustrating the steps according to an embodiment of the present invention.
Figure 1B:
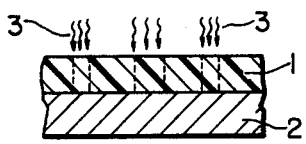

Referring to FIG. 1(b), the resist film 1 is irradiated with the electron beam 3 to describe a desired pattern. In this case, the optimum dosage of electron beam will be from $1 \times 10^{-5}$ to $5 \times 10^{-5}$ C/cm$^2$.

Figure 1C:
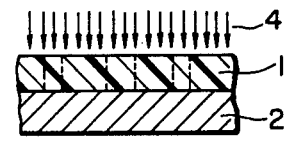

The resist film 1 irradiated with the electron beam is then exposed over its whole surfaces to ultraviolet light 4 as shown in FIG. 1(c). In this case, an ultra-high pressure mercury lamp is used as the source of light, and the exposure is effected at an intensity of 7 to 8 mJ/cm$^2$ over 10 to 30 seconds. In the photoresist film, the regions irradiated with ultraviolet light 4 exhibit markedly increased solubility to a developer for the resist film.

The regions irradiated with the electron beam 3 in the previous step may exhibit slightly increased solubility. In this case, however, since photosensitive radicals possessed by the photoresist film 1 are destroyed, such regions do not develop photochemical reaction even when they are irradiated with ultraviolet light 4 in the above step. Therefore, the solubility of such regions is not increased.

The increase in solubility of the positive-type photoresist caused by the irradiation with ultraviolet light is far greater than the increase in solubility caused by the irradiation with the electron beam. Accordingly, there are formed regions having a greatly increased solubility caused by the irradiation with ultraviolet light 4, and regions having slightly increased solubility caused by the irradiation with the electron beam.

Figure 1D:
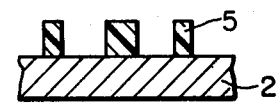

The photoresist film 1 is then subjected to heat-treatment at 100° to 130° C. for 30 minutes (this heat treatment is referred to as after-bake in this specification), and is then developed. Namely, the regions irradiated with the ultraviolet light 4 only are dissolved and removed. The regions irradiated with both the electron beam 3 and ultraviolet light 4, however, are not removed but remain. A resist pattern 5 is thus formed as shown in FIG. 1(d).

The developing is effected by immersing the film in a solution of organic ammonium or in an alkali aqueous solution at a solution temperature of 20° to 25° C. for 1 to 2 minutes.

According to the present invention as mentioned above, a step of exposing the whole surface of the film to ultraviolet light is added to an ordinary step of treating the resist film with the electron beam. The method of the present invention makes it possible to accurately form fine resist patterns of a size smaller than 1 μm.

Figure 2:
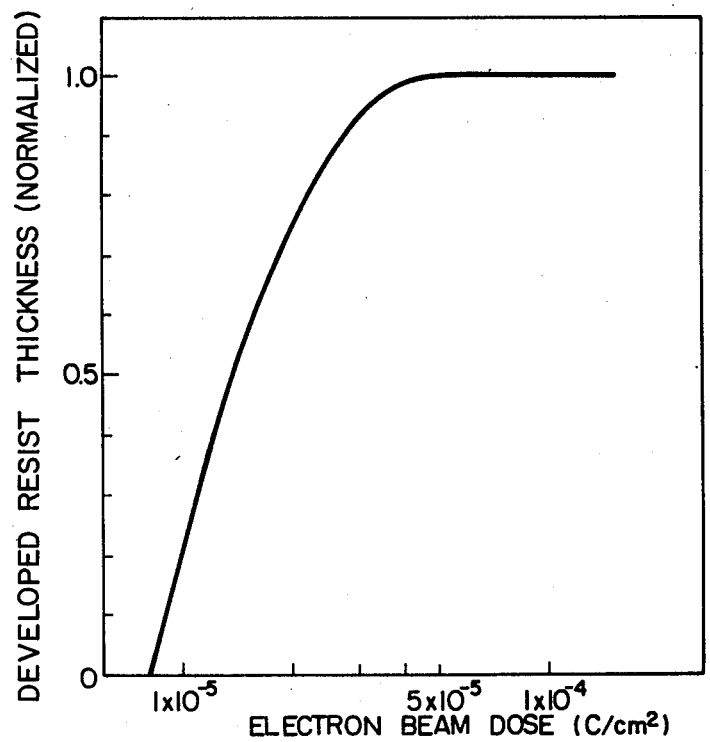
FIG. 2 is a diagram of a curve which shows a relation between the intensity of the electron beam and the film thickness after developing, when the photoresist AZ1350J is treated according to the present invention.

FIG. 2 is a diagram of the sensitivity curve of a resist with respect to the electron beam, the resist being obtained by treating the photosensitive resist AZ1350J under the above-mentioned conditions, and in which the abscissa represents the dosage of electron beam (C/cm$^2$) and the ordinate represents the ratio of film thickness of the negative-type pattern after development (ratio of the thickness of the resist film of the portions irradiated with the electron beam after development to the thickness of the resist film after being pre-baked). As will be obvious from FIG. 2, the resist pattern is formed if the dosage of electron beam is greater than about $1 \times 10^{-5}$ C/cm$^2$. To obtain sharp patterns, however, the dosage of the electron beam should be $1 \times 10^{-5}$ to $5 \times 10^{-5}$ C/cm$^2$.

EXAMPLE 2

Good resist patterns having line widths and gaps of 1.0 μm, 1.5 μm, 2.0 μm and 3.0 μm are obtained when the AZ1350J photoresist having a thickness of 0.55 μm is treated in accordance with the steps of Example 1 under the conditions of an electron beam dosage of $3 \times 10^{-5}$ C/cm$^2$, an ultraviolet light exposure of 8 mJ/cm$^2$, and effecting the after-bake at 110° C. for 20 minutes and the developing using MF312 (a developing solution prepared exclusively for AZ photoresist, a product of Shippley Co.): water = 50:100.

When a pattern is formed by using the negative-type electron resist according to the conventional method, hair-like scums develop when the gap of linear patterns become smaller than 1 μm, and it becomes necessary to remove such scums by treatment with oxygen plasma or the like. According to the present invention, however, there develops no scum, and very sharp patterns can be formed.

EXAMPLE 3

FIG. 3 is a diagram illustrating the steps according to another embodiment of the present invention.

Figure 3A:
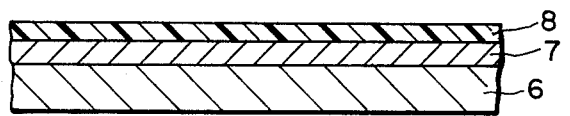
FIGS. 3(*a*) to 3(*f*) are a diagram illustrating the steps according to another embodiment of the present invention.

Referring to FIG. 3(a), first, an aluminum film 7 which is to be processed is formed by vacuum vaporization method on the surface of a silicon substrate 6, and a photoresist AZ1350J (trade name, a product of Shippley Co.) is applied as a photoresist film 8 to a thickness of 0.8 μm onto the aluminum film 7.

Figure 3B:
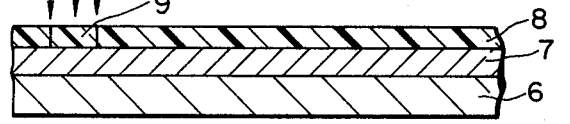

After being pre-baked at 80° C. for 20 minutes, a desired region 9 in the photoresist film 8 is irradiated with an electron beam 3 as shown in FIG. 3(b) using an electron-beam lithographic apparatus. The electron beam dosage in this case is $3 \times 10^{-5}$ coulomb/cm$^2$.

Figure 3C:
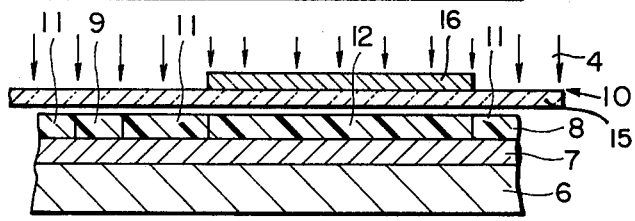

Referring to FIG. 3(c), desired regions 11 in the photoresist film 8 and the region 9 irradiated with the electron beam 3 in the above step are selectively irradiated with ultraviolet light 8 using a chromium mask 10. As can be appreciated, the chromium mask 10 consists of a lower transparent portion 15 and an upper opaque chromium mask pattern 16. The irradiation is effected by using a mercury lamp having an output of 13 mW as a source of light, for an exposure time of 12 seconds.

The regions 11 in the photoresist film 8 irradiated with the ultraviolet light 4 exhibit increased solubility in the developer, but the regions 12 which are not irradiated with the ultraviolet rays exhibit solubility which is not increased.

The region 9 irradiated with the electron beam 3 in the previous step exhibits slightly increased solubility. However, since the photosensitive radicals have been destroyed by the irradiation with the electron beam, the region 9 does not exhibit increased solubility even when it is irradiated with the ultraviolet light 4 in the step of irradiating with ultraviolet light.

The positive-type photoresist irradiated with the ultraviolet light exhibits far greater solubility than the solubility of the portions irradiated with the electron beam. Consequently, there are formed regions 11 having the greatest solubility owing to the irradiation with the ultraviolet light 4 only, the region 9 having slightly increased solubility after being irradiated with both the electron rays 3 and ultraviolet light 4, and the region 12 which is irradiated with neither the electron beam nor the ultraviolet light and which exhibits the same solubility as the original photoresist film.

Figure 3D:
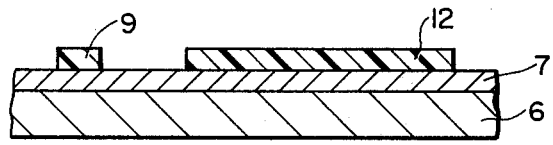

Namely, when the after-baking is effected at 120° C. for 20 minutes, followed by the developing using the MF-312 developer or the AZ developer (which are developing solutions for the AZ1350J produced by Shippley Co.) at a liquid temperature of 23° C. for 1 minute, the regions 11 irradiated with the ultraviolet light only are removed, and the region 12 which is not irradiated with the rays and the region 9 irradiated with both the electron beam and ultraviolet light are left, thereby to form resist patterns 9, 12 as shown in FIG. 3(d), since the solubility of the regions 11 irradiated with the ultraviolet light only is very much greater than the solubility of the region 9 irradiated with both the electron beam and ultraviolet light.

Figure 3E:
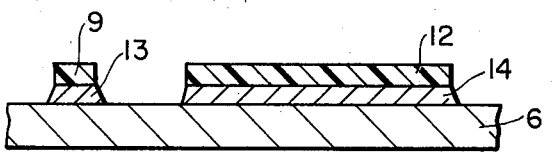
Figure 3F:
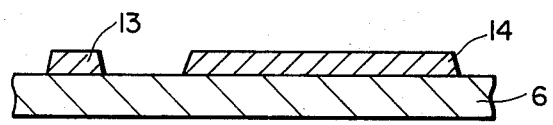

After the post-baking is effected at 120° C. for 20 minutes, if the exposed portions of the aluminum film 7 are removed as shown in FIG. 3(e) using resist patterns 9, 12 formed by the above-mentioned developing as masks, and if the resist pattern is removed from the aluminum film, there are formed patterns 13, 14 consisting of aluminum film as shown in FIG. 3(f).

As will be obvious from the foregoing description, the shape of the pattern 13 is determined by the irradiation with electron beams, and the shape of the pattern 14 is determined by the irradiation with ultraviolet light.

The irradiation with the electron beams makes it possible to form fine patterns maintaining very high precision. Therefore, the above pattern 13 is suited for forming wirings in the semiconductor devices.

On the other hand, the pattern formed by the irradiation with ultraviolet light has a precision that is smaller than that of the pattern formed by the irradiation with the electron beam. Therefore, the pattern 14 is suited for forming scribe lines or bonding pads of semiconductor devices having relatively wide areas and which do not require strict precision for the shapes and sizes.

Magnetic bubble memory elements and semiconductor integrated circuits contain fine patterns which require very high precision and patterns of relatively large areas which do not require high precision.

The electron beam lithography helps obtain very high precision. When used for forming patterns of large areas, however, the electron beam lithography requires greatly extended periods of time before the patterns are described. When the ultraviolet rays are employed, on the other hand, the exposure needs be effected one time only, but it is difficult to form fine patterns maintaining precision.

In other words, if it is attempted to form all patterns in the magnetic bubble memory elements and semiconductor integrated circuits by the electron beam lithography, the patterns can be formed maintaining high precision but requiring greatly extended periods of time. If the ultraviolet rays only are employed, on the other hand, it is difficult to obtain fine patterns maintaining high precision.

According to the present invention, however, fine patterns only which require high precision are formed by the irradiation with the electron beam, and patterns of large areas which do not require high precision are formed by the irradiation with ultraviolet light. Therefore, the patterns of required precisions can be formed without requiring extended periods of time. Furthermore, as will be apparent from the foregoing description, the present invention can be very easily put into practice without requiring skilled works or any particularly designed devices.

The present invention was accomplished based on a discovery that the solubility of the positive-type photoresist increases quite differently depending upon whether it is irradiated with the electron beam or ultraviolet light, and that the regions irradiated with the electron beam do not exhibit increased solubility even when they are further irradiated with ultraviolet light. Based upon the above-mentioned discovery, the present invention makes it possible to easily form patterns having required precisions without requiring extended periods of time.

This fact makes the present invention greatly distinguished over any other related inventions.

According to the present invention, it is essential that the photosensitive radicals in the positive-type photoresist are destroyed by the irradiation with the electron beam, and the solubility thereof is not increased by the subsequent irradiation with the ultraviolet light.

In order to reliably achieve the objects of the present invention by destroying the photosensitive radicals, the intensity of the electron beam used for the irradiation must be greater than about $1 \times 10^{-6}$ coulomb/cm$^2$. When the intensity of the electron beam is smaller than the above value, the photosensitive radicals are not sufficiently destroyed, and the solubility is increased by the subsequent irradiation with ultraviolet light and, hence, the positive-type photoresist is dissolved by the developing and is removed.

When the intensity of the electron beam becomes greater than about $1 \times 10^{-4}$ coulomb/cm$^2$, on the other hand, it becomes difficult to form fine patterns. Therefore, the intensity of the electron beam should range from about $1 \times 10^{-6}$ to $1 \times 10^{-4}$ coulomb/cm$^2$.

Exposure of the photoresist to the ultraviolet light should be performed under ordinary conditions in which the positive-type photoresist is exposed. For example, good results will be obtained when a mercury lamp having an output of 13 mW is used as a source of light, and the irradiation is continued for 8 seconds.

Although the above-mentioned embodiment has employed the photoresist AZ1350J, it is of course allowable to use the AZ-type photoresists such as AZ2400 and the like that have been placed in the market by Shippley Co.

The present invention can further be put into practice by using not only the AZ-type photoresists but also using other positive-type photoresists such as OFPR-type photoresists manufactured by Tokyo Ohka Kogyo Co. The positive-type photoresists can be developed by using specified developing liquids under specified conditions. As for the AZ-type photoresists, there can be used MF-312 developer, AZ developer or AZ2401 developer depending upon the kind of the photoresist or the irradiation conditions. The developing will be effected under specified conditions of, for example, 23° C. for 1 minute.

The pre-baking effected prior to the irradiation with the electron beam is a widely accepted practice in the art of photolithography, and is advantageous from the standpoint of increasing the adhesiveness by removing solvent. The pre-baking should be effected at a temperature of about 60° to 90° C. for 20 to 30 minutes.

The after-baking, which is effected after the ultraviolet light exposure but before the developing is effected, is not an essential requirement for the present invention but is very effective from the practical point of view.

The baking should be effected at a temperature of 100° to 140° C.

When the after-baking is effected at a temperature of lower than 100° C., adhesiveness is exhibited little with respect to the layer that is to be processed. When the after-baking is effected at a temperature of higher than 140° C., the thermal crosslinking reaction of the polymer proceeds, and the solubility of the whole photoresist film so decreases that it becomes difficult to effect the developing. The most desirable temperature ranges from 120° to 130° C.

The baking (post-baking) effected after the developing is not an indispensable step for the present invention. The baking, however, is effected to increase the resistance of the layer when it is to be subjected to the etching using the resist pattern as a mask. The baking is effected at a temperature of nearly 90° to 100° C.

The layer to be processed may be subjected to the ordinary wet-type etching using various etching solutions. The precision, however, can be greatly increased by the dry-type etching such as the etching by the reactive sputtering.

According to the conventional method, the positive-type photoresist is simply used to form a photoresist pattern. Therefore, the photoresist has very small resistance against dry etching, and it is difficult to subject a metal film or an insulation film to the dry etching by using the positive-type photoresist as a mask. According to the present invention, however, the photosensitive radicals are destroyed by the irradiation with the electron beam and the photoresist pattern is hardened to exhibit very great resistance against dry etching. Therefore, it is possible to effect the dry etching using the thus hardened photoresist pattern as a mask. According to the present invention, therefore, it is easy to form fine patterns having a line width of 0.5 μm. If the beam of electrons is converged more finely, it is possible to form patterns having line widths of 0.2 to 0.3 μm.

Instead of irradiating with the electron beam, it is also possible to irradiate with the so-called far ultraviolet light having wavelengths of smaller than about 300 nm in combination with the above-mentioned ultraviolet light, such that the regions irradiated with the far ultraviolet light are left as photoresist patterns like the case when the electron beam are used for the irradiation.

In this case, a suitable dosage of far ultraviolet light for forming the photoresist patterns will be from about 200 to 300 mW/cm²·sec.

According to the present invention as illustrated in the foregoing, the photoresist patterns are formed having increased resistance against dry etching. Namely, the photoresist patterns are very well suited for processing workpieces by the dry etching. Furthermore, the present invention is capable of quickly forming fine patterns which require high degree of precision as well as patterns which require relatively small precision, and is very effective for the production of magnetic bubble memory elements and semiconductor integrated circuits in which such patterns are contained in a mixed manner.

What is claimed is:

1. A method of forming patterns comprising:
   (1) a step of adhering a positive-type photoresist film onto a layer that is to be processed;
   (2) a step for irradiating predetermined regions of said positive-type photoresist film with an electron beam, said electron beam having a sufficient intensity to destroy the photosensitive radicals of said positive-type photoresist film in the predetermined regions, whereby said predetermined regions are rendered insensitive to ultraviolet light;
   (3) a step for irradiating regions of the photoresist film with ultraviolet light, said regions including at least the regions of said positive-type photoresist film irradiated with the electron beam;
   (4) a step for developing said positive-type photoresist film, and removing the regions irradiated with ultraviolet light only, to form a resist pattern;
   (5) a step for removing the exposed portions of said layer that is to be processed by the etching using said resist patterns as masks; and
   (6) a step for removing said resist patterns.

2. A method of forming patterns according to claim 1, wherein whole surfaces of said photoresist film are irradiated with the ultraviolet light.

3. A method of forming patterns according to claim 2, wherein the intensity of said electron beam is about $1 \times 10^{-6}$ to $1 \times 10^{-4}$ coulomb/cm².

4. A method of forming patterns according to claim 2 or 3, wherein said photoresist film is heated at about 100° to 140° C. after it is exposed to the ultraviolet light but prior to being subjected to the developing.

5. A method of forming patterns according to claim 1, wherein predetermined regions of said photoresist film are selectively irradiated with the ultraviolet light.

6. A method of forming patterns according to claim 5, wherein the intensity of said electron beam is about $1 \times 10^{-6}$ to $1 \times 10^{-4}$ coulomb/cm².

7. A method of forming patterns according to claim 5 or 6, wherein said photoresist film is heated at about 100° C. to 140° C. after it is exposed to the ultraviolet light but prior to being subjected to the developing.

8. A method of forming patterns according to claim 1, wherein said step for removing the exposed portions of said layer that is to be processed is a dry-etching step.

9. A method of forming patterns according to claim 2 or 5, wherein said photoresist film is heated at about 60°–90° C. prior to said step for irradiating predetermined regions of said positive-type photoresist film.

10. A method of forming patterns according to claim 2 or 5, wherein the resist pattern, after the step for developing but before said step for removing, is baked at a temperature of 90°–100° C.

11. A method of forming patterns according to claim 1, wherein the intensity of said electron beam is about $1 \times 10^{-6}$ to $1 \times 10^{-4}$ coulomb/cm².

12. A method of forming patterns according to claim 11, wherein the intensity of said electron beam is about $1 \times 10^{-5}$ to $5 \times 10^{-5}$ coulomb/cm².

* * * * *